(12) United States Patent
Yeh

(10) Patent No.: US 7,126,395 B2
(45) Date of Patent: Oct. 24, 2006

(54) DYNAMIC SLEW RATE CONTROLLING METHOD AND DEVICE FOR REDUCING VARIANCE IN SIMULTANEOUS SWITCHING OUTPUT

(75) Inventor: Chun-Wen Yeh, Taipei (TW)

(73) Assignee: Ali Corporation, Taipei (TW)

( * ) Notice: Subject to any disclaimer, the term of this patent is extended or adjusted under 35 U.S.C. 154(b) by 32 days.

(21) Appl. No.: 11/113,228

(22) Filed: Apr. 25, 2005

(65) Prior Publication Data
US 2005/0283749 A1    Dec. 22, 2005

(30) Foreign Application Priority Data
Jun. 18, 2004    (TW) .............................. 93117668 A

(51) Int. Cl.
*H03K 5/12*    (2006.01)
(52) U.S. Cl. ...................................... 327/170; 327/384
(58) Field of Classification Search ..................... None
See application file for complete search history.

(56) References Cited
U.S. PATENT DOCUMENTS 6,175,928 B1 *    1/2001    Liu et al. ..................... 713/401
6,380,777 B1 *    4/2002    Degardin et al. ............ 327/170
6,489,807 B1 *    12/2002   Genna et al. .................. 326/56
6,654,310 B1 *    11/2003   Nam ..................... 365/230.06
6,834,381 B1 *    12/2004   Gonzalez ...................... 716/13
6,906,567 B1 *    6/2005    Culler ........................ 327/170
7,038,482 B1 *    5/2006    Bi .............................. 324/769
2001/0030561 A1 *    10/2001    Asano et al. ............... 327/170
2005/0253635 A1 *    11/2005    Hargan ........................ 327/170

* cited by examiner

*Primary Examiner*—Timothy P. Callahan
*Assistant Examiner*—Cassandra Cox
(74) *Attorney, Agent, or Firm*—Birch, Stewart, Kolasch & Birch, LLP

(57) ABSTRACT

A dynamic slew rate controlling method and a device is provided to reduce SSO variance generated from voltage noises, which is as a result of a plurality of data bits switching to the same state simultaneously while the I/O bus transmits these data bits. The device and method at first analyzes data patterns, then determines the slew rate controlling setting value based on the slew rate controlling mapping table corresponding to different data patterns, and then transmits the setting value to the I/O buffer with the same voltage level in order to reduce the SSO variance.

11 Claims, 5 Drawing Sheets

DYNAMIC SLEW RATE CONTROLLING METHOD AND DEVICE FOR REDUCING VARIANCE IN SIMULTANEOUS SWITCHING OUTPUT

BACKGROUND OF THE INVENTION

1. Field of the Invention

The present invention relates to a dynamic slew rate controlling method and a device for reducing the variance in simultaneous switching output (SSO).

2. Description of the Prior Art

As the frequency of data processing becomes higher and higher, the requirement of faster input/output transferring rates for operating systems to catch up with the high speed data processing frequencies is growing higher and higher accordingly. The simultaneous switching output has become critical when it comes to input/output rate of operating systems.

When several data bits are switched simultaneously, the input/output buffer (I/O buffer) in an input/output bus (I/O bus) suffers consequential signal variant noises. In other words, when several data bits switch from their "high" to "low" levels or from their "low" to "high" levels, the inductance effect accompanied by transmitted data signals bounces the levels of the power source and ground, leading to a variety of slew rates of data bits on the part of the I/O buffer. When the bounce on power and ground grows larger, the SSO variance becomes larger, and the effective data range becomes narrower.

Please refer to FIG. 1, a schematic diagram illustrates noises resulted from level bounces of a four-bit input/output buffer when one to four data bits are switched simultaneously. Curve A shows the waveform of variance of the power source/ground level as a data bit is switched; curve B shows the waveform of variance as two data bits are switched simultaneously; curve C shows the waveform of variance as three data bits are switched simultaneously; and curve D shows the waveform for variance from four data bits thereby.

The inductance effect leads to voltage drops in accordance with the equation of $V=L*(\Delta I/\Delta t)$, wherein L refers to the inductance and $(\Delta I/\Delta t)$ refers to the current variance in a given period of time. Even if the inductance remains unchanged but several data bits switch at the same time, the voltage drop still accumulates to a certain level, causing bounces in the levels of the power source and ground. Consequently, various changes of the slew rates of data bits lead to an increase of the variance in SSO after the data bits pass through the I/O buffer.

Please refer to FIG. 2A, it shows an original waveform being inputted to the I/O buffer, and in FIG. 2B, it presents various outputted slew rates while different numbers of data bits switch simultaneously. The variance in SSO is represented as "e" in the figure. Four curves A, B, C, and D display the changes of slew rates caused by voltage drops in FIG. 1 of the least, second to least, second to most, and the most simultaneously switching data bits.

When data bits are switching, slew rates thereof are changing gradually. As the diagram shown in FIG. 2B, curve A represents a rising, a smooth and horizontal, and a falling curve finally; curve B represents a gently rising and gently falling curve; curve C is more gentle curve, and curve D shows a least rising and falling curve.

The slew rate variance "e", arising from the different numbers of simultaneously switching data bits, affects the determination of valid data such as the data segment "f." The data segment "f" becomes undistinguishable because of high frequency switching such as the simultaneous switching output of data bits in the situation of the I/O buses of the central processing unit, data transmission of system memories and I/O transmission between computer peripherals.

When more and more data bits with the same data pattern switch, the consequential bounces on voltage level of the power source and ground reduces the outputted slew rates of these data bits.

A lot of methods for reducing the SSO variance have been disclosed in the past couple of years such as U.S. Pat. No. 5,229,657, which provides a method and a device for reducing the simultaneous switching noise in the IC output circuit. Please refer to FIG. 3, a circuit diagram showing an output holding register. The output holding register 30 includes a plurality of flip-flops 301, 302, 303, and 304, signal lines 311, 312, 313, and 314, pads 321, 322, 323, and 324, tri-state controllers 331, 332, 333, and 334.

Every flip-flop is supposed to keep one data bit. These signal lines 311, 312, 313, and 314 receive data bits transmitted by a serial shift register 300. Taking the flip-flop 301 for example, the flip-flop 301 receives the timing pulse from the timing pulse line 305 by the timing pulse input end CK thereof and the data bit from the serial shift register 300 by its input end D and transmits the received data bit to the output end Q thereof. The data bit outputted from the output end Q is further transmitted through the tri-state driver 331 to the pad 321 of the circuit. The control signal line 306 controls the status of the tri-state driver 331.

Except the flip-flop 301 directly receives the timing pulse signal by its timing pulse input end CK, other flip-flops 302, 303, and 304 require additional circuits or logic gates for delaying timing pulse signals in order to take care the simultaneous switching noises of data bits when they reach the pads.

Another method of pre-driver skewing is also proposed to prevent noises accompanied by the simultaneous switching of data bits by taking advantage of the RC-delay to reduce the slew rate of pre-stage drivers.

Another method of low-weight coding is also provided by simultaneously decreasing switching bits so as to reduce the SSO variance.

However, the I/O buffer of the prior art has a fixed driving capability to the pre-driver or post-driver under the routine operating circumstance, and is therefore incapable of reducing the SSO variance when several data bits switch simultaneously.

SUMMARY OF THE INVENTION

It is therefore a primary objective of the present invention to provide a controlling method and a device for reducing variance in SSO when data bits are transmitted to the I/O bus and the voltage noises are raised since several data bits are switched to the same state simultaneously.

In accordance with the claimed invention, the present method analyzes data patterns of these data bits and generates a slew rate controlling mapping table accordingly. The controlling mapping table corresponds the slew rate setting values to the corresponding data bits where there are different data patterns and transmits these values to the I/O buffer to reduce the SSO variance.

The present device includes a data pattern detecting unit for detecting the switching signals of the inputted data bits, a calculating unit electrically connected to the data pattern detecting unit for receiving outputs from the data pattern detecting unit, a slew rate controlling mapping table electrically connected to the calculating unit for receiving outputs of the calculating unit, a slew rate controlling bus connected to the mapping table for receiving outputs thereof, and a slew rate controlling unit within the I/O buffer and connected to the slew rate controlling bus for receiving outputs thereof.

DETAILED DESCRIPTION OF THE PREFERRED EMBODIMENT

In a general input/output system, the I/O buffer of the I/O bus suffers signal variance (jitter) arising from the simultaneous switching output (SSO). The signal variance becomes more and more serious when more and more data bits switch simultaneously. It leads to an inductance effect coming along with data signals, causing voltage level bounces in the power source and ground and lowering of the slew rate of the I/O buffer. Once the voltage level bounces too much, the effective data range is narrowed to such a region that data bits become undistinguishable. In this case, the present invention progressively increases the driving capability of the I/O buffer in order to increase the slew rate. Otherwise, the present invention is employed to reduce slew rate by decreasing the driving capability.

The present invention is implemented to achieve the purpose of reducing the SSO variance by analyzing data patterns to determine the setting value of the slew rate. The setting value is used to apply to every I/O buffer operated under the same electrical circumstance. In one of the embodiments, it shows that about 30 percent of SSO variance is reduced after adopting the method of the present invention.

Figure 1:
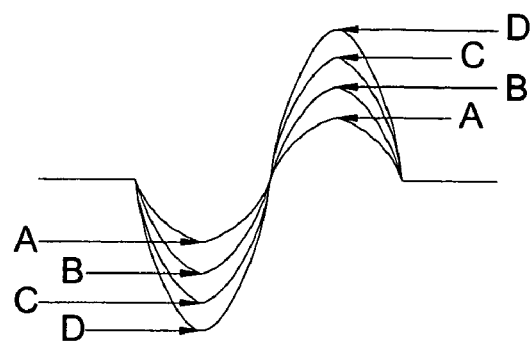
FIG. 1 is a schematic diagram showing voltage level bounces when one to four data bits switched simultaneously.
Figure 2A:
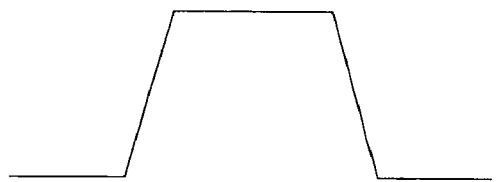
FIG. 2A shows an original waveform inputted to the I/O buffer.
Figure 2B:
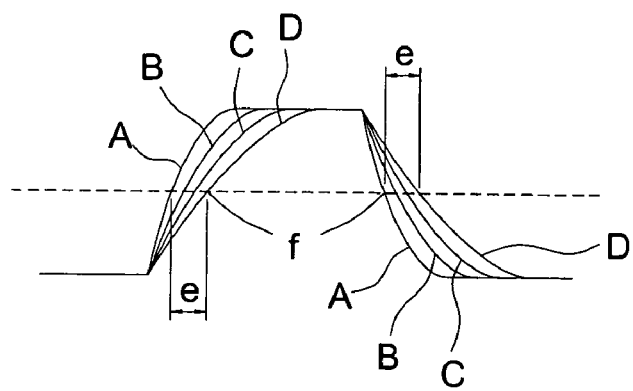
FIG. 2B shows a corresponding slew rate variance as data bits inputted and converted simultaneously.
Figure 3:
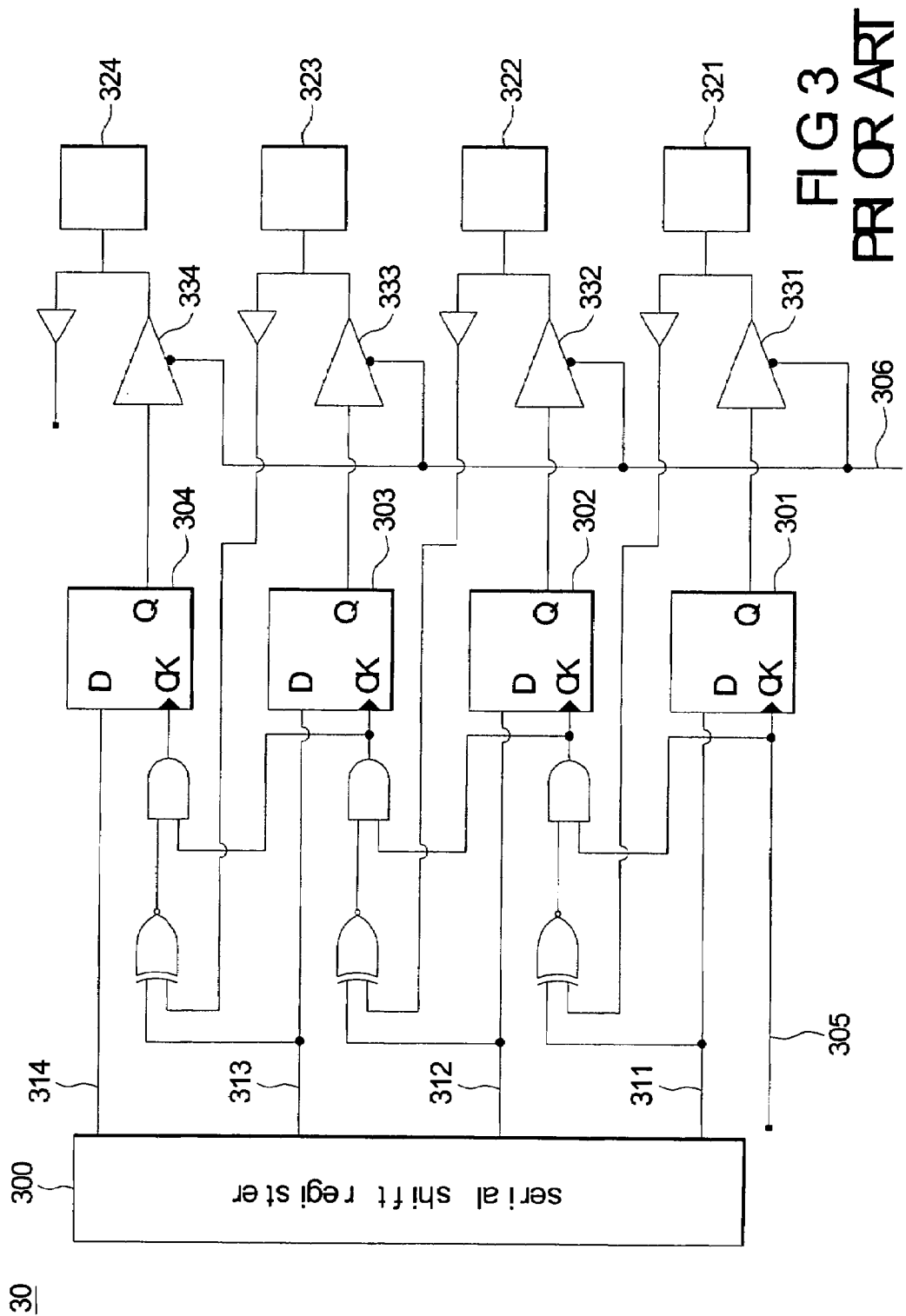
FIG. 3 is a circuit diagram showing a prior art output holding register for reducing the SSO variance.
Figure 4:
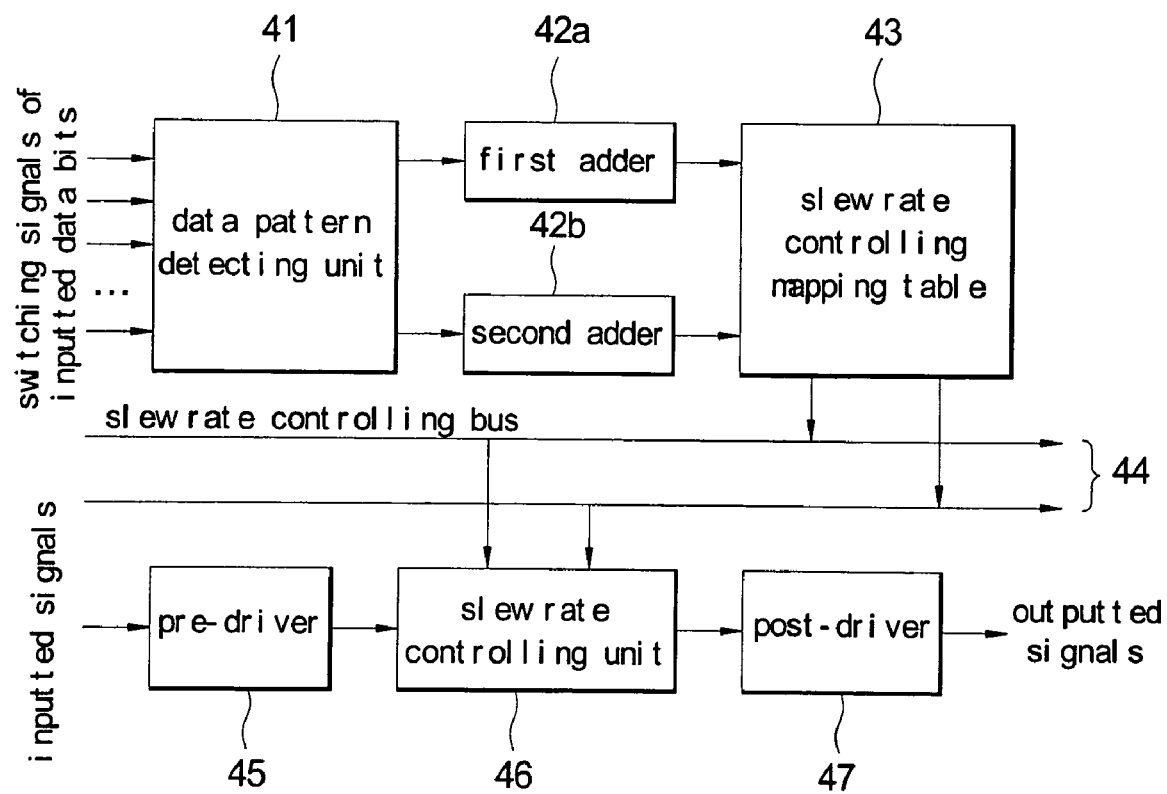
FIG. 4 is a schematic diagram showing a controlling device for reducing the SSO variance.

Please refer to FIG. 4, a schematic diagram shows a slew rate-controlling device for reducing the SSO variance according to the present invention. This embodiment is a pattern-compensated dynamic slew rate-controlling (PCD-SRC) device, which includes a plurality of elements interconnected with each other. Thus the controlling device includes a data pattern-detecting unit 41, a calculating unit such as adders 42a and 42b, a slew rate controlling mapping table 43, and a slew rate controlling unit 46. The controlling device analyzes data patterns of inputted data and dynamically adjusts slew rates of these data bits in the I/O buffer. The preferred embodiment of the present invention is to adjust the slew rates between the pre-driver 45 receiving inputted data bits and the post-driver 47 outputting data bits, thereafter the device is used to automatically adjust slew rates to compensate for the SSO variance arising from the simultaneous switching of several data bits. The aforementioned I/O buffer is used for increasing the driving capability of input/output data bits.

As shown in FIG. 4, the data pattern detecting unit 41 detects switching signals of inputted data bits in order to obtain the number of switches from 1 to 0 or from 0 to 1, and the information regarding data bits sharing the same power source and ground. And the unit 41 is used to analyze whether the data pattern is a rising (from 0 to 1) or descending (from 1 to 0) one. Then the results are outputted to the calculating unit such as adders 42a and 42b shown in this embodiment, for operating the calculations such as transmitting the rising signal to the first adder 42a and sending the descending signal to the second adder 42b.

Outcomes from the adders 42a and 42b are transmitted to the slew rate controlling mapping table 43, which is the mapping table of the data patterns and the slew rates. A slew rate controlling setting value is determined from the mapping table in the meanwhile, and the setting values is corresponding to the data patterns as being inputted. If more and more data bits switch simultaneously and have the same data pattern in terms of waveform (rising or descending), the inductance effect will cause voltage levels to bounce more seriously between the power source and ground, lower the outputted slew rate, and contribute larger SSO variance. Thereby the present invention method progressively increases the driving capability of the I/O buffer in order to increase the slew rate gradually. On the other hand, if less and less data bits having the same data pattern switch simultaneously, the voltage level bounces less and less due to the inductance effect, meanwhile, the slew rates of outputs are getting large. Namely, the present invention method decreases the driving capability of the I/O buffer so as to decrease the slew rate.

Additionally, the slew rate controlling mapping table 43 is a programmable one and is flexible in different situations to provide appropriate slew rates.

Outcomes generated from different data patterns with rising or descending waveforms are transmitted to the slew rate-controlling unit 46 via the slew rate controlling bus 44. Therefore, in a preferred embodiment of the I/O buffer of an input/output system, it significantly reduces the amount of SSO variance coming from simultaneous switching of data bits after passing through the pre-driver 45 and post-driver 47. Particularly, the present invention device is not limited to be used between the pre-driver 45 and the post-driver 47.

The present invention also provides a corresponding method incorporating the aforementioned device to compensate the variances in slew rates by dynamically controlling the slew rate for data pattern compensation as different data bits switch. In other words, the present method dynamically adjusts the driving capabilities of the I/O buffer in order to adjust the slew rate and compensate for the variance in SSO with respect to different data patterns.

Figure 5:
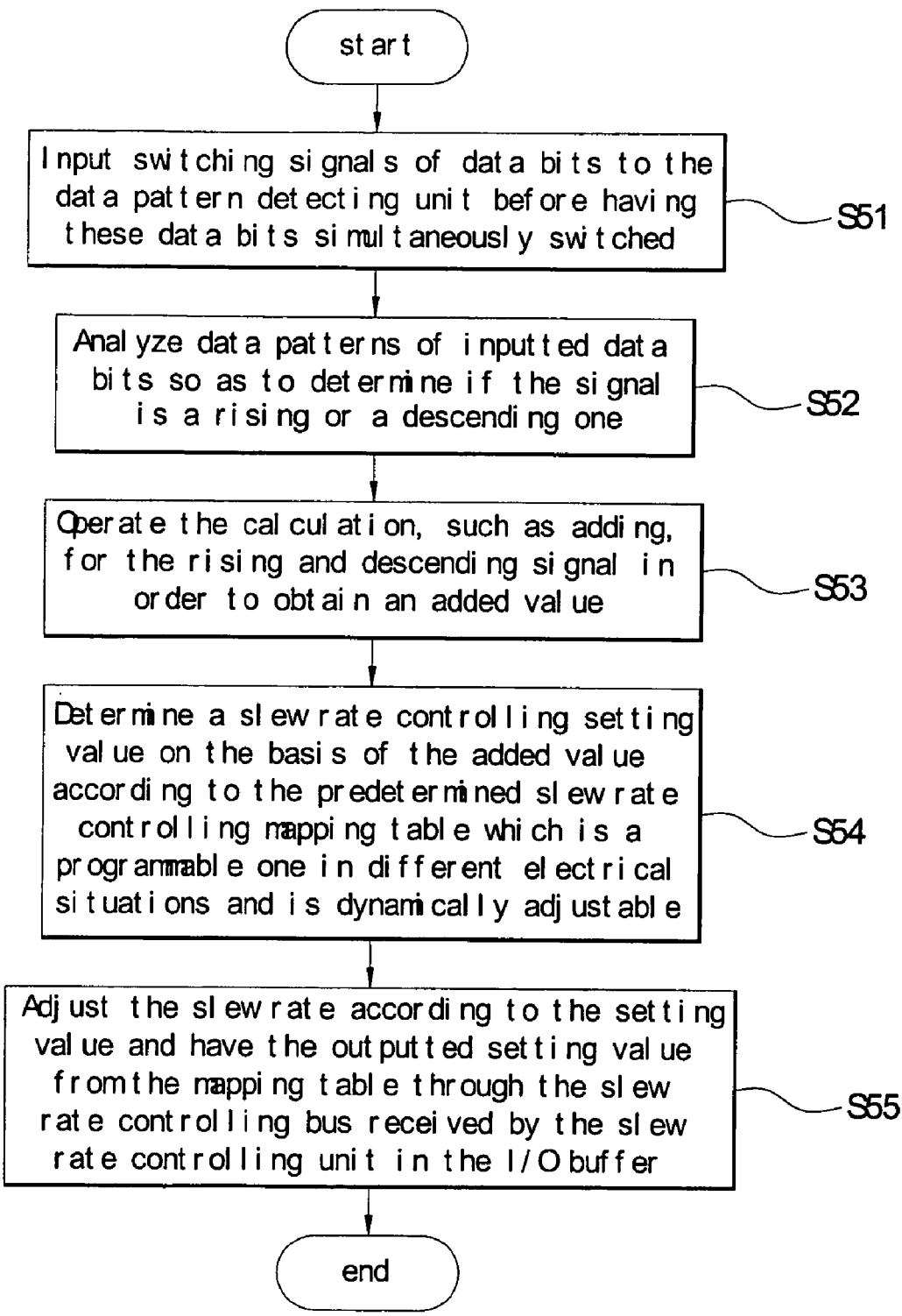
FIG. 5 is a flow chart showing the controlling method for reducing the SSO variance.

Please refer to FIG. 5 of a flow chart showing the present invention method. The present invention method includes the steps of inputting switching signals of data bits to the data pattern detecting unit before having these data bits simultaneously switched (S51), analyzing data patterns of inputted data bits so as to determine if the signal is a rising or a descending one (S52), operating the calculation, such as adding, for the rising and descending signal in order to obtain an added value (S53), determining a slew rate controlling setting value on the basis of the added value according to the predetermined slew rate controlling mapping table which is a programmable one in different electrical situations and is dynamically adjustable (S54), and adjusting the slew rate according to the setting value and having the outputted setting value from the mapping table received by the slew rate controlling unit in the I/O buffer through the slew rate controlling bus (S55).

Whereby, the system is able to adjust slew rates in order to reduce the SSO variance. Practically speaking, a fundamental slew rate controlling setting value is provided in advance and the slew rates in different situations are adjustable on the basis of this fundamental setting value to compensate for the voltage level bounces arising from the switching of data bits between the power source and ground, thus making up for the consequential slew rate variances.

Figure 6:
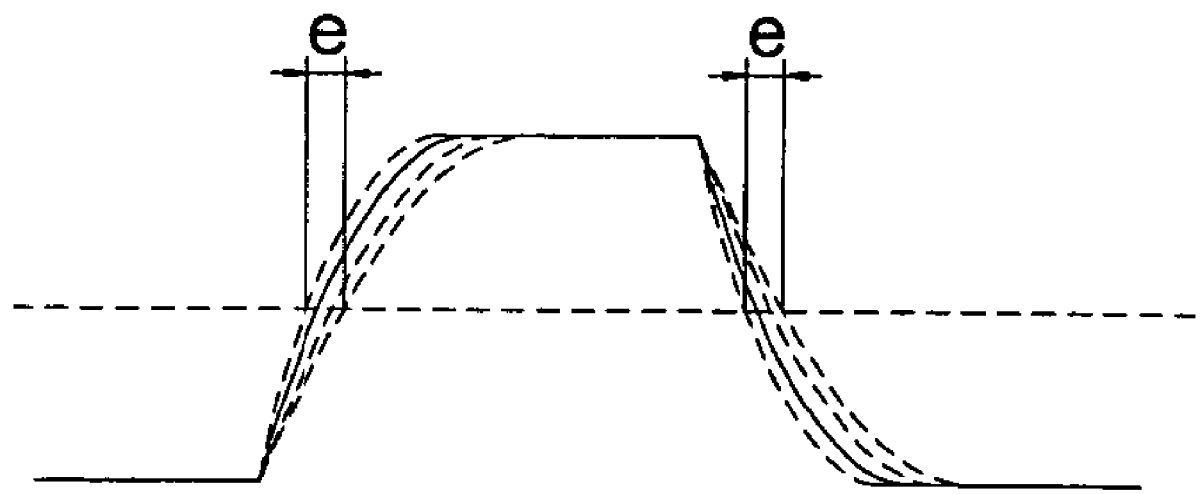
FIG. 6 shows the effect on slew rate variance after the present invention method and device have been adopted.

Please refer to FIG. 6, a schematic diagram showing the effect after the present invention method is adopted for dynamically compensating different data patterns and voltage level bounces between the power source and ground to reduce the SSO variance "e".

In conclusion, the present invention provides a dynamic slew rate controlling method and device for dynamically adjusting the driving capability of an input/output buffer in order to change the slew rate. Meanwhile, the SSO variance, which is caused by the voltage noises generated from the simultaneous switching of several data bits in the same state when the data bits are transmitted to the I/O bus, is improved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A dynamic slew rate controlling device for reducing the variance in simultaneous switching output (SSO), in which the SSO variance is reduced by analyzing a data pattern and controlling the slew rate of the data bits when different data bits are converted in order to dynamically adjust the driving capability of an input/output buffer (I/O buffer), the controlling device comprises:
    a data pattern detecting unit for detecting the switching signals of the inputted data bits;
    a calculating unit electrically connected to the data pattern detecting unit for receiving outputs of the data pattern detecting unit;
    a slew rate controlling mapping table electrically connected to the calculating unit for receiving outputs thereof;
    a slew rate controlling bus connected to the slew rate controlling mapping table for receiving outputs thereof; and
    a slew rate controlling unit located within the I/O buffer for connecting the slew rate controlling bus and receiving outputs thereof.

2. The controlling device of claim 1, wherein the calculating unit is an adder processing the rising signals and the descending signals.

3. The controlling device of claim 1, wherein the slew rate controlling mapping table is a mapping table establishing the relationship between data patterns and slew rates.

4. The controlling device of claim 1, wherein the slew rate controlling mapping table is a programmable slew rate controlling mapping table.

5. A dynamic slew rate controlling method for reducing the variance in simultaneous switching output (SSO), which is used to modify slew rates by analyzing data patterns of data bits and dynamically adjusting the driving capability of an input/output buffer (I/O buffer) in order to compensate the slew rates of the data bits, the method comprises:
    receiving the switching signals of the data bits by a data pattern detecting unit;
    analyzing the data pattern of the switching signals of the data bits in order to determine whether the switching signal is a rising or descending signal;
    operating the calculation;
    determining a slew rate setting value with respect to a slew rate controlling mapping table; and
    adjusting the slew rate.

6. The controlling method of claim 5, wherein the step of operating the calculation is implemented by an adder for adding the switching signals.

7. The controlling method of claim 5, wherein the step of operating the calculation is implemented by a first adder for receiving the rising switching signal and a second adder for receiving the descending switching signal.

8. The controlling method in claim 5, wherein the step of determining the slew rate setting value with respect to the slew rate controlling mapping table is to correspond the data patterns with their corresponding slew rates.

9. The controlling method in claim 5, wherein the step of adjusting the slew rate is implemented by a slew rate controlling unit receiving outputs of the setting value of the slew rate controlling mapping table via a slew rate controlling bus.

10. The controlling method in claim 5, wherein the step of adjusting the slew rate is to adjust the driving capabilities of the I/O buffer between the input and output data bits.

11. The controlling method in claim 5, wherein the slew rate controlling mapping table is a programmable slew rate controlling mapping table.

* * * * *